(12) United States Patent
Odagiri (10) Patent No.: US 11,482,951 B2
(45) Date of Patent: Oct. 25, 2022

(54) BRAKE DRIVING CONTROL CIRCUIT AND BREAKDOWN DETECTION METHOD THEREOF

(71) Applicant: NIDEC CORPORATION, Kyoto (JP)

(72) Inventor: Hideyuki Odagiri, Nagano (JP)

(73) Assignee: NIDEC CORPORATION, Kyoto (JP)

( * ) Notice: Subject to any disclaimer, the term of this patent is extended or adjusted under 35 U.S.C. 154(b) by 21 days.

(21) Appl. No.: 16/771,675

(22) PCT Filed: Dec. 4, 2018

(86) PCT No.: PCT/JP2018/044558
§ 371 (c)(1),
(2) Date: Jun. 10, 2020

(87) PCT Pub. No.: WO2019/116963
PCT Pub. Date: Jun. 20, 2019

(65) Prior Publication Data
US 2020/0313578 A1 Oct. 1, 2020

(30) Foreign Application Priority Data

Dec. 11, 2017 (JP) .............................. JP2017-236877

(51) Int. Cl.
*H02P 3/08* (2006.01)
*G01R 31/34* (2020.01)
(Continued)

(52) U.S. Cl.
CPC .............. *H02P 3/08* (2013.01); *G01R 31/343* (2013.01); *H02M 7/06* (2013.01); *B25J 9/1628* (2013.01)

(58) Field of Classification Search
CPC ......... H02P 3/08; H02P 3/025; G01R 31/343; B60T 2270/414; F16D 2121/22; B25J 19/0004; G05B 2219/41279
See application file for complete search history.

(56) References Cited

U.S. PATENT DOCUMENTS 6,294,887 B1 * 9/2001 Shimogama .............. H02P 3/04
318/362
9,598,064 B2 3/2017 Tanabe et al.
(Continued)

FOREIGN PATENT DOCUMENTS

JP 2000296492 10/2000
JP 2001346400 12/2001
(Continued)

OTHER PUBLICATIONS

"International Search Report (Form PCT/ISA/210) of PCT/JP2018/044558," dated Mar. 5, 2019, with English translation thereof, pp. 1-3.

*Primary Examiner* — Eduardo Colon Santana
*Assistant Examiner* — Devon A Joseph
(74) *Attorney, Agent, or Firm* — JCIPRNET (57) ABSTRACT

The brake driving control circuit, which controls an electromagnetic brake that releases the brake by applying a current, is provided with: a first rectifying element provided between a first power supply of a first circuit voltage and one terminal of the electromagnetic brake; a cut-off switch inserted into a line through which the first power supply supplies power; a first switching element provided between the other terminal of the electromagnetic brake and a ground point; and a second switching element and a second rectifying element provided in series between a second power supply of a second circuit voltage, which is different from the first circuit voltage, and the one terminal of the electromagnetic brake.

12 Claims, 3 Drawing Sheets

(51) Int. Cl.
*H02M 7/06* (2006.01)
*B25J 9/16* (2006.01)

(56) References Cited

U.S. PATENT DOCUMENTS

| | | |
|---|---|---|
| 10,250,169 B2 | 4/2019 | Nishino |
| 10,715,059 B2 * | 7/2020 | Saito ......................... H02P 3/04 |
| 2002/0017882 A1 * | 2/2002 | Shimogama ............. B66D 5/30 |
| | | 318/56 |
| 2006/0192515 A1 | 8/2006 | Takayama et al. |
| 2007/0163322 A1 * | 7/2007 | Hirakawa .............. B25J 9/1674 |
| | | 72/187 |
| 2015/0316111 A1 * | 11/2015 | Tanabe .................. B60T 13/748 |
| | | 700/245 |

FOREIGN PATENT DOCUMENTS

| | | |
|---|---|---|
| JP | 2004306159 | 11/2004 |
| JP | 2005209061 | 8/2005 |
| JP | 2006123118 | 5/2006 |
| JP | 2015211609 | 11/2015 |
| JP | 2017063565 | 3/2017 |
| JP | 2017104939 | 6/2017 |

\* cited by examiner

BRAKE DRIVING CONTROL CIRCUIT AND BREAKDOWN DETECTION METHOD THEREOF

CROSS-REFERENCE TO RELATED APPLICATION

This application is a 371 application of the International PCT application serial no. PCT/JP2018/044558, filed on Dec. 4, 2018, which claims the priority benefits of Japan Patent Application No. 2017-236877, filed on Dec. 11, 2017. The entirety of each of the above-mentioned patent applications is hereby incorporated by reference herein and made a part of this specification.

TECHNICAL FIELD

The present invention relates to a brake driving control circuit that controls driving of an electromagnetic brake attached to a motor or the like, and a breakdown detection method thereof.

BACKGROUND ART

In a robot, an electromagnetic brake is attached to a motor shaft in order to prevent a robot arm from moving or dropping when the power for a motor driving each shaft is cut off, thereby ensuring safety. In general, an electromagnetic brake provided in a robot is of a non-excitation operation type, and is configured to enter a release state when the electromagnetic brake is energized and to operate when the energization is cut off, that is, lock a motor shaft. Further, an electromagnetic brake provided in a robot is required to be able to release the brake in a state in which a power supply for driving a motor is lost in safety standards (UL 1740, ISO 10218) regarding robots. Patent Literature 1 discloses a device in which a motor brake power supply part for energizing an electromagnetic brake to release the brake is provided and the brake is able to be released through an operation with respect to a switch provided in the motor brake power supply part.

An electromagnetic brake provided in a robot is a safety-related mechanism and requires high reliability. When control is performed by only one switch as shown in Patent Literature 1 and the switch breaks down in a short-circuited manner, the brake is always released and there is concern that safety cannot be ensured. Therefore, Patent Literature 2 discloses a brake driving control circuit in which a switching control means is connected to both terminals of an electromagnetic brake in electrical series with the electromagnetic brake in order to enhance safety. A switching transistor is used as the switching control means. The brake driving control circuit described in Patent Literature 2 also includes a voltage detection means that performs detection of a breakdown by detecting a voltage across the electromagnetic brake.

CITATION LIST

Patent Literature

Patent Literature 1: Japanese Patent Laid-Open No. 2000-296492
Patent Literature 2: Japanese Patent Laid-Open No. 2006-123118

SUMMARY OF INVENTION

Technical Problem

In the brake driving control circuit of Patent Literature 2, one of the two switching control means is a low-side switch provided between the electromagnetic brake and a ground potential, whereas the other is a high-side switch provided between the electromagnetic brake and a power supply voltage for brake driving. When the power supply voltage for brake driving is low, it is difficult for problems to occur, whereas when the power supply voltage is high, a device with a high withstand voltage is required for both the low-side switch and the high-side switch. In addition, when the power supply voltage is high, the following problems occur according to a type of device used as the high-side switch. That is, when an N-channel field effect transistor (FET) is used, a driving circuit therefor becomes large in size, the number of components increases, a cost increases, and a mounting area also increases. When a P-channel FET is used, a size of the device increases, an ON-resistance also increases, a loss increases, and there are few options for the device itself. When a bipolar transistor is used, the device size increases and a loss also increases.

The electromagnetic brake requires a considerable amount of current to cause the electromagnetic brake to enter a release state. Thus, when the number of shafts of the robot increases and the number of electromagnetic brakes increases, it is necessary for a large-capacity power supply circuit for an electromagnetic brake to be used. In a robot, a large-capacity power supply circuit with a relatively high voltage is prepared for driving of the motor. However, when the power supply circuit for motor driving is also used as a power supply circuit for brake driving, the above-described problem regarding the high-side switch is not able to be solved. When a power supply circuit with a relatively low voltage for brake driving is separately prepared, the separately prepared power supply circuit also requires a certain capacity, which causes an increase in cost. In the robot, a power supply circuit with a relatively low voltage for a control circuit therefor is prepared. However, the power supply circuit for the control circuit has a comparatively small capacity because the control circuit does not consume much power. In a robot in which a current for brake release is high because the robot has a plurality of shafts, it is not realistic to use the small-capacity power supply circuit for the control circuit as the power supply circuit for brake driving.

An object of the present invention is to provide a brake driving control circuit capable of setting a voltage applied to a switching element used as a high-side switch to a relatively low voltage without impairing safety, and of negating a need for an individual large-capacity power supply circuit, and a method of detecting breakdown of such a brake driving control circuit.

Solution to Problem

A brake driving control circuit of the present invention is a brake driving control circuit for controlling an electromagnetic brake configured to release a brake by being energized, the brake driving control circuit including: a first rectifying element provided between a first power supply for a first circuit voltage and one terminal of the electromagnetic brake; a cut-off switch inserted into a line through which power is supplied to the first power supply to operate the first power supply; a first switching element provided between the other terminal of the electromagnetic brake and a ground point; and a second switching element and a second rectifying element provided in series between a second power supply for a second circuit voltage different from the first circuit voltage and the one terminal of the electromagnetic brake.

In such a brake driving control circuit, the cut-off switch and the first switching element are connected in series across the electromagnetic brake. Thus, even when one side breaks down in a short-circuit mode, it is possible to cut off energization of the electromagnetic brake and maintain a locked state of the electromagnetic brake using the other. On the other hand, since the electromagnetic brake is able to be released by using the second power supply and the second switching element, a requirement based on a safety standard that "a brake is able to be released in a state in which a power supply for driving a motor is lost" is able to be satisfied. Semiconductor elements such as transistors, for example, are able to be used as the first switching element and the second switching element.

In the brake driving control circuit of the present invention, the second circuit voltage is able to be made lower than the first circuit voltage. The second switching element corresponds to a high-side switch, but the second circuit voltage is low. Thus, it is possible for a semiconductor element having a small size due to a low withstand voltage to be used as the second switching element, as compared with the case of being operated with the same voltage as the first circuit voltage, and to simplify a driving circuit for the second switching element.

In the brake driving control circuit of the present invention, it is possible to use a power supply for driving a motor that is a target of a brake operation of the electromagnetic brake as the first power supply, and to use a switch generally provided in a safety circuit for a motor as the cut-off switch. High reliability is required for a safety circuit for a motor. Using a switch for cutting off a power supply for driving a motor in the safety circuit as the cut-off switch in the present invention, it is possible to configure a highly reliable brake driving control circuit that complies with a safety standard in which power to a motor is cut off and a brake is reliably operated.

The brake driving control circuit of the present invention may include a monitoring means configured to monitor a voltage of the one terminal and the other terminal of the electromagnetic brake. By providing such a monitoring means, it is possible to detect breakdown of the switching element and enhance safety. This monitoring means includes, for example, a first monitoring circuit configured to detect a voltage at a connection point between the other terminal of the electromagnetic brake and the first switching element, and a second monitoring circuit configured to detect a voltage at a connection point between the second switching element and the second rectifying element. Using the first monitoring circuit and the second monitoring circuit as described above, it is possible to monitor respective voltages at both terminals of the electromagnetic brake and independently detect breakdown of the first switching element and breakdown of the second switching element.

Alternatively, the brake driving control circuit of the present invention may include a monitoring means including a circuit configured to monitor a voltage across the electromagnetic brake. By providing such a monitoring means, it is possible to detect breakdown of the switching element and enhance safety.

When the monitor means is provided in the present invention, it is preferable for a breakdown detection circuit configured to output a breakdown detection signal on the basis of a monitoring result of the monitoring means and maintain the cut-off switch in an open state to be further provided. By providing such a breakdown detection circuit, it is possible to prevent the first power supply from entering an operating state and also prevent the brake from being released when the switching element breaks down, and to further enhance safety. When the cut-off switch is open on the basis of an output of the breakdown detection signal and a capacitor is provided at an output of the first power supply, an output voltage of the first power supply does not always become zero immediately. Therefore, in the present invention, when the breakdown detection signal is output, it is preferable for, for example, a D-shaft current to be caused to flow through the motor or a discharging resistor to be used for forced discharge of the output of the first power supply, thereby operating the brake sooner.

In the brake driving control circuit of the present invention, a configuration in which, when the cut-off switch is open and the first power supply is not in operation, the first switching element and the second switching element enter an operating state on the basis of an operation of a brake release switch or an input of a brake release command, and the electromagnetic brake is released is adopted. It is possible to reliably release the electromagnetic brake at the time of an emergency through an input of the brake release command from the brake release switch provided for each shaft of the robot or a robot teaching pendant.

In the brake driving control circuit of the present invention, it is preferable for the first switching element to be PWM-driven (pulse width modulation-driven) so that a voltage applied to the electromagnetic brake when the released state of the electromagnetic brake is maintained is lower than a voltage applied to the electromagnetic brake when the electromagnetic brake is caused to transition to the released state. It is possible to achieve power saving by changing a voltage required for a release operation and maintenance of the released state of the electromagnetic brake, and to further achieve power saving by performing PWM driving. In particular, when the robot or the like performs a normal operation, a time when the released state of the electromagnetic brake must be maintained becomes longer, and thus, it is possible to achieve further power saving by performing voltage and PWM driving according to a state.

A breakdown detection method of the present invention is a breakdown detection method in a brake driving control circuit for controlling an electromagnetic brake configured to release a brake by being energized, the brake driving control circuit including a first rectifying element provided between a first power supply for a first circuit voltage and one terminal of the electromagnetic brake, a first switching element provided between the other terminal of the electromagnetic brake and a ground point, and a second switching element and a second rectifying element provided in series between a second power supply for a second circuit voltage different from the first circuit voltage and the one terminal of the electromagnetic brake, the breakdown detection method including: driving the second switching element using a pulse having a length in which the electromagnetic brake does not respond when the first power supply is not in operation; and monitoring a voltage at a connection point between the other terminal of the electromagnetic brake and the first switching element and a voltage at a connection point between the second switching element and the second rectifying element.

According to the breakdown detection method of the present invention, it is possible to individually detect breakdown of the first switching element and breakdown of the second switching element, and further to detect breakdown such as a disconnection (or non-connection) of a circuit for monitoring a voltage of the electromagnetic brake.

The breakdown detection method of the present invention may include further PWM-driving the first switching element when the electromagnetic brake is released, and monitoring the voltage at the connection point between the other terminal of the electromagnetic brake and the first switching element in synchronization with the PWM driving. By performing such monitoring, it is possible to detect breakdown of the first switching element or a disconnection of the electromagnetic brake even when the electromagnetic brake is energized to release the brake.

Advantageous Effects of Invention

According to the present invention, in the brake driving control circuit, it is possible to set a voltage applied to a switching element used as a high-side switch to a relatively low voltage without impairing safety, and it is possible to negate a need for an individual large-capacity power supply circuit. Further, a breakdown detection method capable of reliably detecting breakdown of a switching element or the like in such a brake driving control circuit is provided.

DESCRIPTION OF EMBODIMENTS

Figure 1:
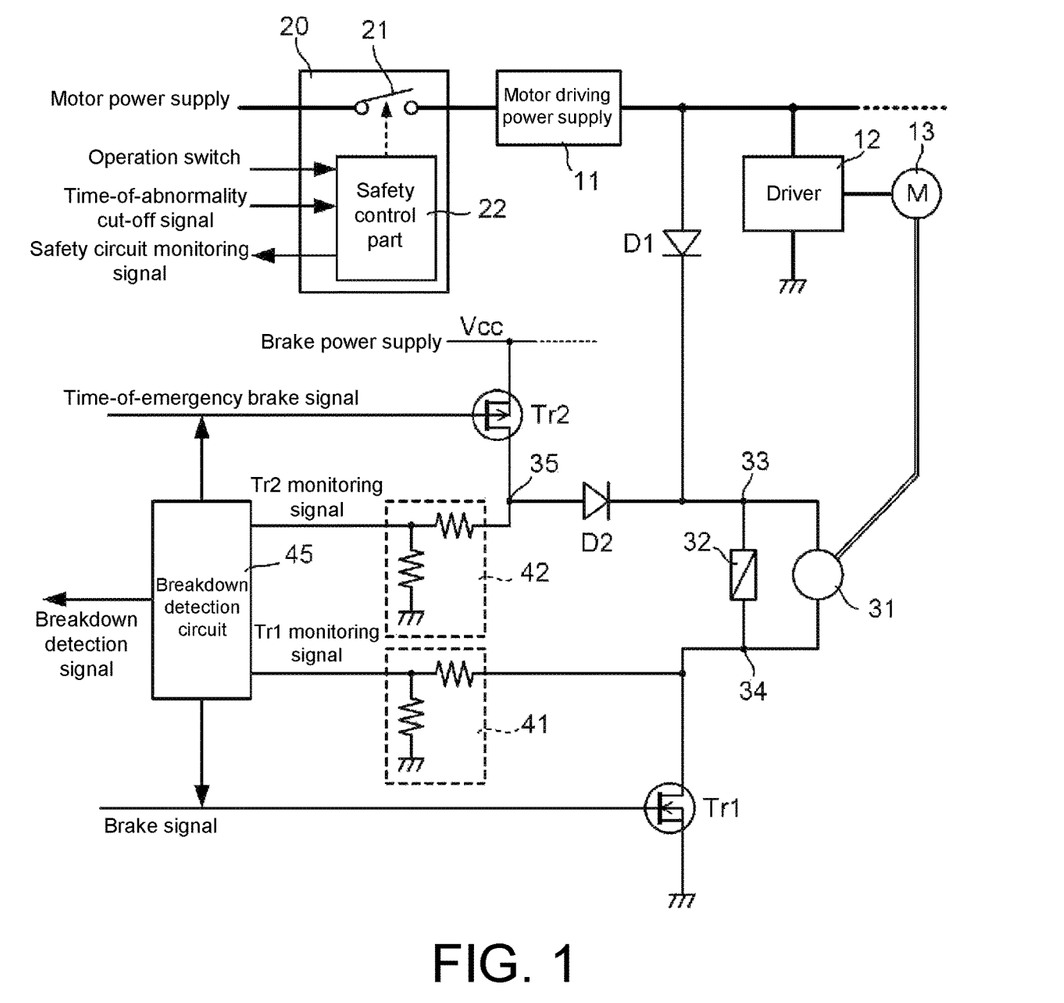
FIG. 1 is a circuit diagram illustrating a brake driving control circuit according to an embodiment of the present invention.

Next, an embodiment of the present invention will be described with reference to the drawings. FIG. 1 is a diagram illustrating a brake driving control circuit according to an embodiment of the present invention, and illustrates a state in which the brake driving control circuit is incorporated in a robot. A plurality of motors 13 that is servo-controlled by a robot controller is provided in the robot, but a motor 13, an electromagnetic brake 31, and a brake driving control circuit for one shaft of the robot are illustrated in FIG. 1.

The electromagnetic brake 31 is mechanically connected to a rotating shaft of the motor 13, as indicated by a double line in FIG. 1. A surge absorber 32 for absorbing a large counter electromotive force generated when a current to a solenoid (coil) of the electromagnetic brake 31 is cut off is provided in the solenoid in parallel. As the surge absorber 32, for example, a varistor or a diode is used. A driver 12 is provided in each motor 13 for each shaft. A motor driving power supply 11 for converting a motor power supply that is an alternating current to a direct current is provided commonly to each shaft, and each driver receives DC power supplied from the motor driving power supply 11 and drives the corresponding motor 13 on the basis of a command from the robot controller.

A safety circuit 20 is provided between the motor power supply and the motor driving power supply 11. This safety circuit 20 is generally provided in a robot in order to ensure a safe operation of the robot, and includes a cut-off switch 21 provided in a line that supplies power from the motor power supply to the motor driving power supply 11 and cuts off the supply of power, and a safety control part 22 that controls the cut-off switch 21. The safety circuit 20 is configured to supply power to the motor driving power supply 11 only when it is able to be confirmed that the robot is safe. A signal from an operation switch or a time-of-abnormality cut-off signal is input to the safety control part 22. The safety control part 22 closes the cut-off switch 21 to supply power to the motor driving power supply when an operation of the robot is instructed by the operation switch, and immediately opens the cut-off switch 21 to stop the supply of power to the motor driving power supply 11 and stop the motors 13 for all shafts when a time-of-emergency cut-off signal is input. Further, the safety control part 22 outputs a safety circuit monitoring signal indicating a state of the safety circuit 20 to the outside. The motor driving power supply 11 and the safety circuit 20 are provided inside the robot controller that connects to the robot and controls the robot.

The safety circuit 20 is a circuit that is directly related to the safety of the robot, and is a highly reliable circuit that complies with various safety standards. Further, when the power to the motor 13 is cut off, the electromagnetic brake 31 for each shaft must operate to lock the motor shaft. Therefore, in the embodiment, the cut-off switch 21 in the safety circuit 20 is used in place of the high-side switch in the brake driving control circuit of the related art as illustrated in Patent Literature 2. This means that the motor driving power supply 11 is used as a power supply for the electromagnetic brake 31, and when the motor driving power supply 11 is not brought into operation and the motor 13 enters a non-driven state, the electromagnetic brake 31 is able to reliably lock the motor shaft. However, using only the motor driving power supply 11 as a driving power supply for the electromagnetic brake 31, a requirement that "a brake is able to be released even in a state in which a power supply for driving a motor is lost" stipulated in the safety standards is not able to be satisfied. Therefore, in the embodiment, a brake power supply is prepared separately from the motor driving power supply 11 so that the electromagnetic brake 31 is able to be released even when the power supply for driving the motor 13 is lost. The time of releasing the electromagnetic brake 31 when the power supply for driving a motor is lost is the time of an emergency, and in that case, the electromagnetic brakes 31 for all the shafts provided in the robot are not simultaneously released, but the electromagnetic brakes 31 are released one by one for the shafts in which brake release is required. Therefore, a capacity required for the brake power supply is at most a capacity with which the electromagnetic brake 31 for one shaft is able to be released, and thus, a power supply provided separately from the motor driving power supply 11 for a control circuit (not illustrated) in the robot controller is able to be used as the brake power supply.

When the electromagnetic brake 31 is driven by the brake power supply, the cut-off switch 21 in the safety circuit 20 is not able to be used in place of the high-side switch, and thus, it is necessary for an independent high-side switch to be provided in each motor 13, as in the circuit illustrated in Patent Literature 2. Further, the motor driving power supply 11 and the brake power supply must be separated. Therefore, the brake driving control circuit of the embodiment includes a transistor Tr1 provided as a low-side switch between a connection point 34 and a ground point, both terminals of the electromagnetic brake 31 being respective connection points 33 and 34, a transistor Tr2 provided as the high-side switch connected to the brake power supply, a diode D1 for reverse voltage blocking provided between the motor driving power supply 11 and the connection point 33, and a diode D2 for reverse voltage blocking provided between the transistor Tr2 and the connection point 33. In a configuration of the brake driving control circuit, the cut-off switch 21 is provided commonly to all the electromagnetic brakes 31 in the robot, but the transistors Tr1 and Tr2 and the diodes D1 and D2 are provided in each of the electromagnetic brakes 31. The transistor Tr1 is, for example, an N-channel FET, and a brake signal is supplied to a gate of the transistor Tr1. The transistor Tr2 is, for example, a P-channel FET, and a time-of-emergency brake signal is supplied to a gate of the transistor Tr2. Here, the motor driving power supply 11 corresponds to a first power supply, the brake power supply corresponds to a second power supply, the transistor Tr1 corresponds to a first switching element, the transistor Tr2 corresponds to a second switching element, the diode D1 corresponds to a first rectifying element, and the diode D2 corresponds to a second rectifying element. Here, the N-channel FET and the P-channel FET are used as the first and second switching elements, respectively, but a device used for each switching element is not limited thereto.

In the circuit of the embodiment, when the electromagnetic brake 31 is released as the motor 13 is driven, it is necessary to supply a current proportional to the number of shafts of the robot, and thus, the motor driving power supply 11 having a large capacity is generally used. When the electromagnetic brake 31 is released at the time of emergency in a state in which the motor 13 is not driven, it suffices to have a capacity required for release of the electromagnetic brake 31 for one shaft. When a voltage of the motor driving power supply 11 is a first circuit voltage and a voltage Vcc of the brake power supply is a second circuit voltage, the first circuit voltage and the second circuit voltage are different, and the second circuit voltage is able to be lower than the first circuit voltage. Since the second circuit voltage is lower than the first circuit voltage and a current needing to flow through the transistor Tr2 is a current for driving the electromagnetic brake 31 for one shaft, it is possible to use a device having a low withstand voltage and a small size as the transistor Tr2 that is the high-side switch, and to also achieve a small driving circuit therefor.

Further, the brake driving control circuit illustrated in FIG. 1 includes monitoring circuits 41 and 42 and a breakdown detection circuit 45 in order to monitor a driving voltage of the electromagnetic brake 31 and perform breakdown detection of the transistors Tr1 and Tr2. The monitoring circuit 41 connects to the connection point 34 that is a connection point between the transistor Tr1 and the electromagnetic brake 31 and outputs a Tr1 monitor signal, and the monitoring circuit 42 connects to a connection point 35 of the transistor Tr2 and the diode D2 and outputs a Tr2 monitor signal. The monitoring circuits 41 and 42 are able to be configured using, for example, a resistive voltage dividing circuit, a level shift circuit, or a photocoupler. In the illustrated example, each of the monitoring circuits 41 and 42 is configured using a resistive voltage dividing circuit in which two resistors are connected in series and a monitor signal is output from a midpoint thereof. The Tr1 monitor signal and the Tr2 monitor signal are input to the breakdown detection circuit 45.

Next, an operation of the brake driving control circuit illustrated in FIG. 1 will be described using a state transition diagram illustrated in FIG. 2. Here, a standby state is a state in which only the control circuit (not illustrated) in the robot controller is energized and no power is supplied to the motor driving power supply 11, and is a state in which the motor 13 is in a free state or a dynamically braked state. In the standby state, no current is supplied to the electromagnetic brake 31, and the motor shaft is locked by the electromagnetic brake 31. The transistor Tr1 that is the low-side switch remains in an OFF state (a cut-off state). On the other hand, a servo ON state is a state in which power is supplied to the motor driving power supply 11 and the motor 13 is servo-driven (a servo locked state), and in this case, the electromagnetic brake 31 is energized and in a brake release state.

In a normal operation, the detection of the breakdown of the transistors Tr1 and Tr2 is performed using the monitoring circuits 41 and 42 in the standby state. Since the electromagnetic brake 31 does not operate when the electromagnetic brake 31 is energized with a very short pulse, a very short pulse (for example, 0.5 milliseconds) is applied from the breakdown detection circuit 45 to the transistor Tr2 in certain periods (for example, 100 milliseconds) so that the transistor Tr2 is driven and the breakdown is monitored. When a voltage of the Tr1 monitor signal does not change to a high level in a pulsed manner in correspondence to the application of the pulse, a determination is able to be made that the transistor Tr1 has not entered the OFF state, that is, the transistor Tr1 has broken down, or that the monitoring circuit 41 has broken down. On the other hand, when a voltage of the Tr2 monitor signal does not change to a high level in a pulsed manner in correspondence to the application of the pulse, a determination is able to be made that the transistor Tr2 has not entered the ON state (a conduction state), that is, the transistor Tr2 has broken down, or that the monitoring circuit 42 has broken down. Irrespective of the breakdown detected, the breakdown detection circuit 45 outputs a breakdown detection signal, and the breakdown detection signal is supplied to the safety circuit 20 as a one of time-of-emergency cut-off signal. Thereby, when breakdown is detected, transition to a servo ON state is prohibited, and transition to an error state occurs.

A transition from the standby state to the servo ON state is caused by a user operating the operation switch of the robot. In the transition to the servo ON state, the cut-off switch 21 in the safety circuit 20 enters a conduction state according to the operation of the operation switch, and power is supplied to the motor driving power supply 11. In this stage, the transistor Tr1 remains in the OFF state according to the brake signal. Further, a breakdown detection operation of the transistors Tr1 and Tr2 performed in the standby state is stopped. The control circuit (not illustrated) in the robot controller detects a command for transition to the servo ON state according to the safety circuit monitoring signal. In this stage, when the Tr1 monitor signal does not reach a high level, a determination is made that the transistor Tr1 breaks down and has not entered the OFF state, that the electromagnetic brake 31 itself has not been connected (or has been disconnected), or that the monitoring circuit 41 has broken down, and the breakdown detection circuit 45 transmits the breakdown detection signal.

In the transition to the servo ON state, when there is no error (for example, detection of breakdown in the breakdown detection circuit 45), the robot enters the servo ON state. In the servo ON state, the transistor Tr1 is driven to enter the ON state according to the brake signal in order to release the electromagnetic brake 31. In this case, the transistor Tr1 may be driven to be always in the ON state, but it is preferable for the transistor Tr1 to be driven through pulse width modulation (PWM) in order to achieve power saving. FIG. 3 is a diagram illustrating a voltage to be applied to the electromagnetic brake 31. A state in which the electromagnetic brake 31 locks the motor shaft is called a brake clamp state. For transition from the brake clamp state to the brake release state, it is necessary for a relatively high voltage to be applied to the solenoid of the electromagnetic brake 31 to move an actuator (not illustrated) in the electromagnetic brake 31. This is called a suction operation. A voltage lower than that at the time of the suction operation may continue to be applied in order to maintain the brake release state after the actuator has moved to a position in the brake release state. This is called a holding operation. The brake voltage may be set to zero in order to operate the brake for transition to the brake clamp state. In practice, a small amount of current not causing the electromagnetic brake 31 to be released is supplied even in the brake clamp state, for example, for a determination as to the breakdown of the transistor Tr1. In the embodiment, the transistor Tr1 is PWM-driven so that an average voltage to be applied to the electromagnetic brake 31 becomes a value in the suction operation, a value in the holding operation, or a value in the brake clamp state, and the operation and release of the electromagnetic brake 31 are performed. Even in a case in which power saving is not intended, PWM driving is performed when the voltage of the motor driving power supply 11 is higher than a rated voltage of the electromagnetic brake 31. When the transistor Tr1 is always in the ON state in the servo ON state for detection of breakdown, the transistor Tr1 is driven with a test pulse that is a short pulse to which the electromagnetic brake does not respond.

The breakdown detection circuit 45 monitors the Tr1 monitor signal in synchronization with the driving of the transistor Tr1. In this case, when the monitor signal does not reach a high level in synchronization with the driving of the transistor Tr1, the breakdown detection circuit 45 determines that the transistor Tr1 has broken down and has not entered the OFF state, that the electromagnetic brake 31 itself has not been connected (or has been disconnected), or that the monitoring circuit 41 has broken down, and outputs the breakdown detection signal. Similarly, when the monitor signal does not reach a low level in synchronization with the driving of the transistor Tr1, the breakdown detection circuit 45 determines that there has been a breakdown or that the transistor Tr1 has not entered the ON state, and outputs the breakdown detection signal. Irrespective of the breakdown detected or even when the robot controller is instructed to perform an emergency stop, the time-of-abnormality cut-off signal is input to the safety circuit 20, the cut-off switch 21 enters a cut-off state, and transition to the error state occurs. It is necessary for the electromagnetic brake 31 to be immediately operated when the transition to the error state occurs, but an output voltage of the motor driving power supply 11 does not always become zero immediately even when the cut-off switch 21 enters the cut-off state because a large-capacity capacitor is generally provided on the output side of the motor driving power supply 11. In this case, when the transistor Tr1 does not transition to the OFF state due to breakdown, the electromagnetic brake 31 does not lock the motor shaft, which is dangerous. Therefore, when the transition from the servo ON state to the error state occurs, for example, a D-shaft current is caused to flow through the motor 13 or a regenerative voltage discharging resistor is used so as to perform forced discharge and forcedly cause the output voltage of the motor driving power supply 11 to be zero, thereby operating the brake sooner.

When normal stopping of the robot is instructed according to, for example, an operation of the operation switch in a state in which there is no error, transition from the servo ON state to the standby state occurs. This transition is a transition to the servo OFF state. In the transition to the servo OFF state, the cut-off switch 21 enters the OFF state according to, for example, the operation of the operation switch, and the control circuit (not illustrated) in the robot controller detects a command for transition to the standby state according to the safety circuit monitoring signal from the safety circuit 20. Further, in the transition to the servo OFF state, the transistor Tr1 enters the OFF state, error detection in the standby state according to the test pulse is enabled, and transition to the standby state occurs.

Next, an operation at the time of emergency will be described. A function of releasing the electromagnetic brake 31 even in a state in which the power supply for driving the motor 13 is lost, as stipulated in a safety standard, is provided assuming a case in which a servo mechanism breaks down in a state in which a person or an object is caught, for example. In the brake driving control device of the present invention, this function is realized by using the brake power supply and the transistor Tr2, and the electromagnetic brake 31 is released by power from the brake power supply according to an input from a brake operation command from an operation pendant (not illustrated) connected to the robot controller or an operation of a brake operation switch provided for each shaft of the robot, as described above. This brake release operation at the time of emergency is able to be executed when the cut-off switch 21 in the safety circuit 20 is in an OFF state and the motor driving power supply is in the OFF state.

Figure 2:
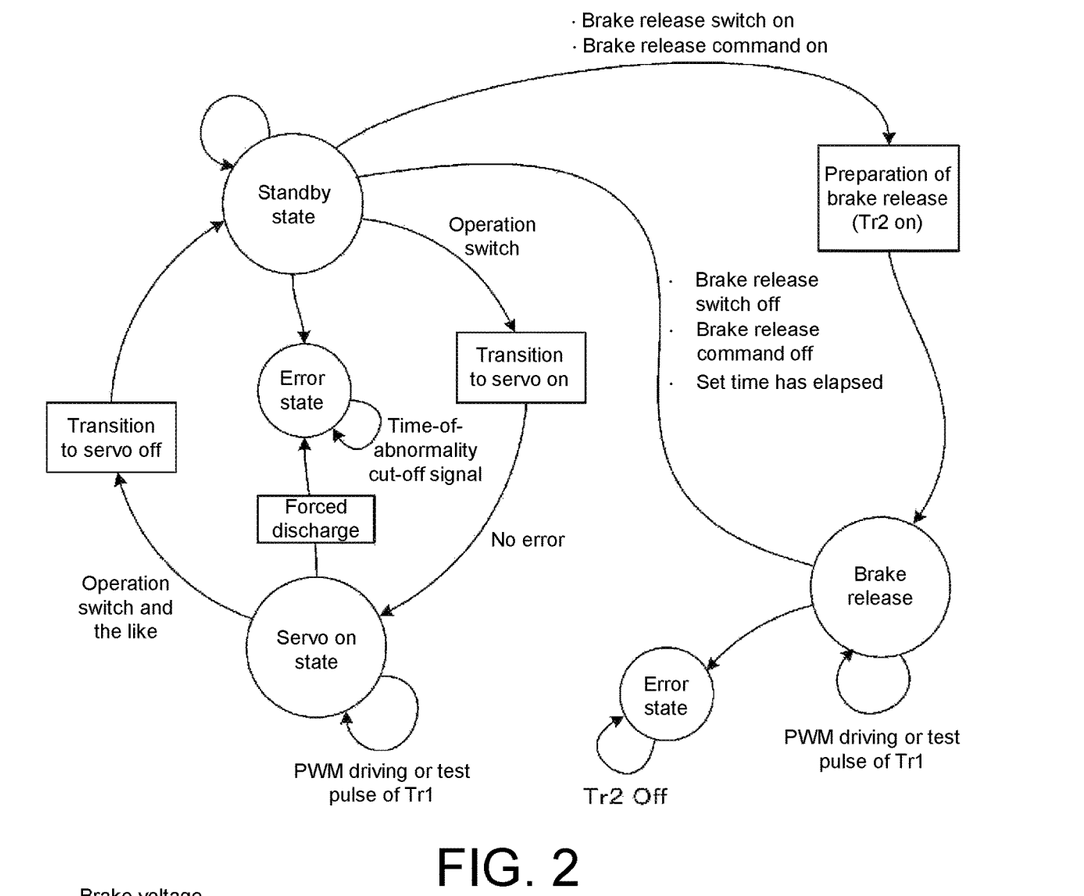
FIG. 2 is a state transition diagram illustrating an operation of the brake driving control circuit illustrated in FIG. 1.
Figure 3:
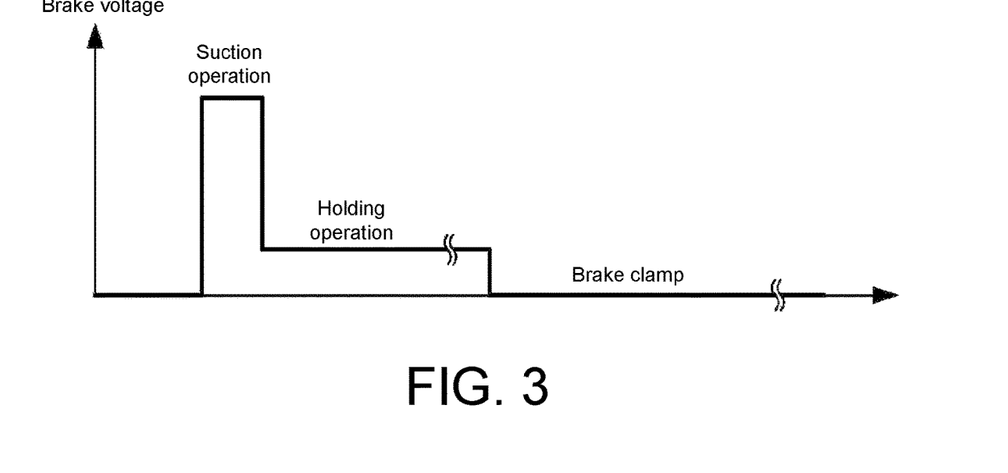
FIG. 3 is a diagram illustrating a current flowing through an electromagnetic brake.

Transition to a brake release preparation stage occurs according to a brake release switch operation or a brake release command ON, as illustrated in the state transition diagram in FIG. 2. In this stage, the transistor Tr2 connected to the brake power supply enters the ON state according to the time-of-emergency brake signal. Then, the transistor Tr1 is caused to enter the ON state due to PWM driving or the transistor Tr1 is caused to enter the ON state with a test pulse, as in the servo ON state described above. Thereby, a current flows through the electromagnetic brake 31 and the brake is released. When the voltage Vcc of the brake power supply is lower than the output voltage of the motor driving power supply 11, whether the transistor Tr1 is PWM-driven or always ON depends on a specification of the electromagnetic brake 31 and the voltage Vcc. When the PWM driving is performed, the transistor Tr2 may be PWM-driven and the transistor Tr1 may always enter the ON state. The breakdown detection circuit 45 detects the breakdown of the transistor Tr1 on the basis of the Tr1 monitor signal in synchronization with the driving of the transistor Tr1 as described above, and the robot transitions to the error state when the breakdown is detected. In this error state, the transistor Tr2 enters the OFF state and the brake release operation is prohibited.

In the brake release operation at the time of emergency, when a certain time has elapsed from the brake release state, the electromagnetic brake 31 is de-energized, thereby preventing the shafts from dropping due to a weight of the robot or the like. Therefore, when the brake release switch is turned OFF, when the brake release command is turned OFF, and when a set time has elapsed, the robot returns from the brake release state to the original standby state.

Effects of Embodiment

According to the above-described embodiment, since the electromagnetic brake 31 is released using the power from the motor driving power supply 11 without using the high-side switch when a normal operation is performed, and the electromagnetic brake 31 is able to be released using power from a small-capacity brake power supply with a comparatively low voltage when the power supply for driving the motor 13 is lost, it is possible to achieve the high-side switch and the driving circuit therefor with a small scale and a low withstand voltage, and to reduce costs without impairing safety. Further, by providing the monitoring circuits 41 and 42 and the breakdown detection circuit 45, it is possible to reliably detect the breakdown of the transistors Tr1 and Tr2, which are switching elements for release of the electromagnetic brake 31, and to further enhance the safety.

Another Embodiment of the Invention

Figure 4:
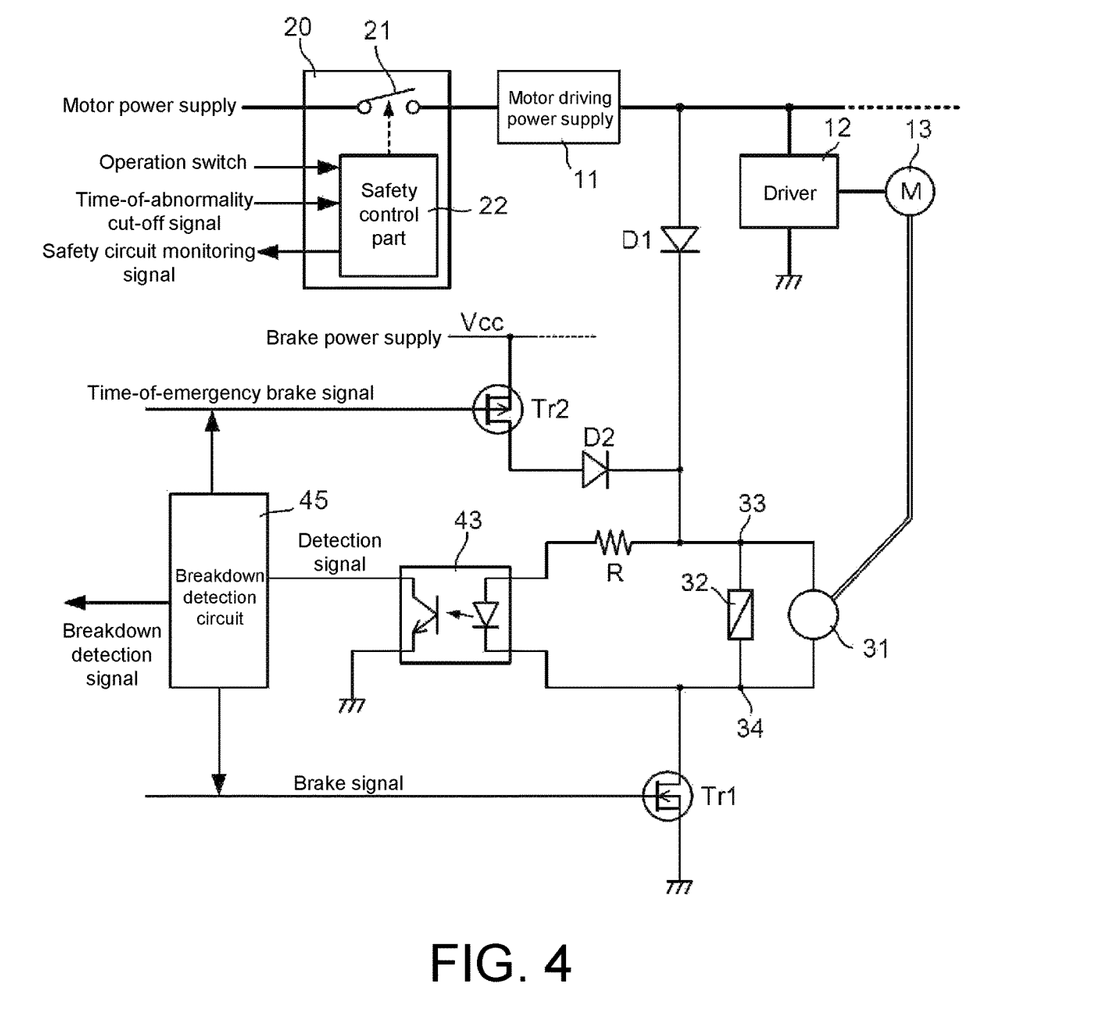
FIG. 4 is a circuit diagram illustrating the brake driving control circuit according to the embodiment of the present invention.

FIG. 4 illustrates a brake driving control circuit according to another embodiment of the present invention. The brake driving control circuit illustrated in FIG. 4 is obtained by removing the monitoring circuits 41 and 42 in the circuit illustrated in FIG. 1 and providing a resistor R and a photocoupler 43 instead. The resistor R and a light emitting element in the photocoupler 43 are connected in series, and both terminals of this series connection body are connected to both terminals (connection points 33 and 34) of the electromagnetic brake 31, respectively. A detection signal from a light receiving element side in the photocoupler 43 is input to the breakdown detection circuit 45. This configuration including the resistor R and the photocoupler 43 is the same as a configuration used for breakdown detection in Patent Literature 2, and performs the breakdown detection on the basis of a change in detection signals when the transistor Tr1 and the transistor Tr2 separately enter the ON state and the transistor Tr1 and the transistor Tr2 simultaneously enter the ON state. In the configuration illustrated in FIG. 4, the breakdown detection is performed in the same procedure as that described with reference to the circuit illustrated in FIG. 1, but the detection of the breakdown of the transistor Tr1 is not able to be performed according to on the test pulse in the brake release state. When the transistor Tr1 is PWM-driven at the time of brake release, it is possible to detect breakdown of the transistor Tr1 during the brake release by appropriately setting an allowable range of current discontinuity in the electromagnetic brake 31 and an operating point of the photocoupler 43.

Effects of the Embodiment

In the embodiment, it is possible to achieve the high-side switch or the driving circuit therefor with a small scale and a low withstand voltage, and reduce costs without impairing safety. Further, in the embodiment, with a simple configuration in which a photocoupler is used, it is possible to detect the breakdown of the transistors Tr1 and Tr2, which are switching elements for release of the electromagnetic brake 31, and to further enhance the safety.

The invention claimed is:

1. A brake driving control circuit, for controlling an electromagnetic brake configured to release a brake by being energized, the brake driving control circuit comprising: a first rectifying element provided between a first power supply for a first circuit voltage and one terminal of the electromagnetic brake; a cut-off switch inserted into a line through which a power is supplied to the first power supply to operate the first power supply; a first switching element provided between another terminal of the electromagnetic brake and a ground point; and a second switching element and a second rectifying element provided in series between a second power supply for a second circuit voltage lower than the first circuit voltage and the one terminal of the electromagnetic brake, wherein the second circuit voltage is greater than 0; a monitoring means configured to monitor a voltage of the one terminal and the other terminal of the electromagnetic brake; wherein the monitoring means includes a first monitoring circuit configured to detect a voltage at a connection point between the other terminal of the electromagnetic brake and the first switching element, and a second monitoring circuit configured to detect a voltage at a connection point between the second switching element and the second rectifying element.

2. The brake driving control circuit according to claim 1, wherein the monitoring means includes a first monitoring circuit configured to detect a voltage at a connection point between the other terminal of the electromagnetic brake and the first switching element, and a second monitoring circuit configured to detect a voltage at a connection point between the second switching element and the second rectifying element.

3. The brake driving control circuit according to claim 1, further comprising:
a breakdown detection circuit configured to output a breakdown detection signal on the basis of a monitoring result of the monitoring means and maintain the cut-off switch in an open state.

4. The brake driving control circuit according to claim 3, wherein the breakdown detection circuit is configured such that an output of the first power supply is discharged when the breakdown detection signal is output.

5. The brake driving control circuit according to claim 1, comprising:
a monitoring means including a circuit configured to monitor a voltage between two terminals of the electromagnetic brake.

6. The brake driving control circuit according to claim 5, further comprising:
a breakdown detection circuit configured to output a breakdown detection signal on the basis of a monitoring result of the monitoring means and maintain the cut-off switch in an open state.

7. The brake driving control circuit according to claim 6, wherein the breakdown detection circuit is configured such that an output of the first power supply is discharged when the breakdown detection signal is output.

8. The brake driving control circuit according to claim 1, wherein when the cut-off switch is open and the first power supply is not in operation, the first switching element and the second switching element enter an operating state on the basis of an operation of a brake release switch or an input of a brake release command, and the electromagnetic brake is released.

9. The brake driving control circuit according to claim 8, wherein the first switching element is PWM-driven so that a voltage applied to the electromagnetic brake when a released state of the electromagnetic brake is maintained is lower than a voltage applied to the electromagnetic brake when the electromagnetic brake transitions to the released state.

10. The brake driving control circuit according to claim 1, wherein the first switching element is PWM-driven so that a voltage applied to the electromagnetic brake when a released state of the electromagnetic brake is maintained is lower than a voltage applied to the electromagnetic brake when the electromagnetic brake transitions to the released state.

11. A breakdown detection method in a brake driving control circuit for controlling an electromagnetic brake configured to release a brake by being energized, the brake driving control circuit including a first rectifying element provided between a first power supply for a first circuit voltage and one terminal of the electromagnetic brake, a first switching element provided between an other terminal of the electromagnetic brake and a ground point, and a second switching element and a second rectifying element provided in series between a second power supply for a second circuit voltage different from the first circuit voltage and the one terminal of the electromagnetic brake, the breakdown detection method comprising:

driving the second switching element using a pulse having a length in which the electromagnetic brake does not respond when the first power supply is not in operation; and monitoring a voltage at a connection point between the other terminal of the electromagnetic brake and the first switching element and a voltage at a connection point between the second switching element and the second rectifying element.

12. The breakdown detection method according to claim 11, comprising:

PWM-driving the first switching element when the electromagnetic brake is released, and monitoring the voltage at the connection point between the other terminal of the electromagnetic brake and the first switching element in synchronization with the PWM driving.

* * * * *